US010804598B2

(12) United States Patent  
Cong et al.

(10) Patent No.: US 10,804,598 B2  
(45) Date of Patent: Oct. 13, 2020

(54) VARIABLE IMPEDANCE MATCHING NETWORKS FOR STRETCHABLE ANTENNAS

(71) Applicant: Verily Life Sciences LLC, South San Francisco, CA (US)

(72) Inventors: Peng Cong, Burlingame, CA (US); You Zou, Redwood City, CA (US)

(73) Assignee: Verily Life Sciences LLC, South San Francisco, CA (US)

( * ) Notice: Subject to any disclaimer, the term of this patent is extended or adjusted under 35 U.S.C. 154(b) by 49 days.

(21) Appl. No.: 16/225,822

(22) Filed: Dec. 19, 2018

(65) Prior Publication Data

US 2019/0198980 A1  Jun. 27, 2019

Related U.S. Application Data

(60) Provisional application No. 62/608,833, filed on Dec. 21, 2017.

(51) Int. Cl.  
*H01Q 7/00* (2006.01)  
*H01Q 1/27* (2006.01)  
(Continued)

(52) U.S. Cl.  
CPC ............ *H01Q 1/273* (2013.01); *H01Q 1/085* (2013.01); *H01Q 7/00* (2013.01); *H03H 7/38* (2013.01);  
(Continued)

(58) Field of Classification Search  
CPC ............ H01Q 1/085; H01Q 1/08; H01Q 1/02; H01Q 1/27; H01Q 1/273; H01Q 7/00;  
(Continued)

(56) References Cited

U.S. PATENT DOCUMENTS 5,128,686 A     7/1992  Tan et al.  
6,642,892 B2 *  11/2003  Masaki ................ H01Q 1/2266  
                                                343/700 MS  
(Continued)

OTHER PUBLICATIONS

Arriola et al., "Stretchable Dipole Antenna for Body Area Networks at 2.45?GHz", IET Microwaves, Antennas & Propagation, vol. 5, No. 7, 2011, pp. 852-859.  
(Continued)

*Primary Examiner* — Tho G Phan  
(74) *Attorney, Agent, or Firm* — Kilpatrick Townsend & Stockton LLP

(57) ABSTRACT

One example device having a variable impedance matching network includes a flexible substrate configured to flex in at least an X dimension and a Y dimension, wherein the X and Y dimensions are orthogonal and coplanar with a surface of the flexible substrate; an antenna formed on the flexible substrate, the antenna deformable in at least one of the X or Y dimensions, wherein an inductance ("$L_A$") of the antenna varies based on a flexing of the flexible substrate in the at least one of the X or Y dimensions, an impedance matching network formed on the flexible substrate and coupled to the antenna, the impedance matching network deformable in the at least one of the X or Y dimensions, and wherein a capacitance ("$C_M$") or inductance ("$L_M$") of the impedance matching network is configured to vary (i) based on the flexing of the flexible substrate in the at least one of the X or Y dimensions and a separation between two portions of the impedance matching network, and (ii) in proportion to the varying of $L_A$ to maintain a substantially constant impedance of the combination of the impedance matching network and the antenna.

22 Claims, 12 Drawing Sheets

(51) Int. Cl.
  *H05K 1/02* (2006.01)
  *H05K 1/16* (2006.01)
  *H01Q 1/08* (2006.01)
  *H03H 7/38* (2006.01)
  *H04B 5/00* (2006.01)

(52) U.S. Cl.
  CPC .......... *H04B 5/0075* (2013.01); *H05K 1/025* (2013.01); *H05K 1/028* (2013.01); *H05K 1/162* (2013.01); *H05K 1/165* (2013.01)

(58) Field of Classification Search
  CPC   H03H 7/38; H05K 1/02; H05K 1/025; H05K 1/028; H05K 1/16; H05K 1/162; H05K 1/165; H04B 5/00; H04B 5/0075
  See application file for complete search history.

(56) References Cited

U.S. PATENT DOCUMENTS

| | | | |
|---|---|---|---|
| 7,365,698 B2 | 4/2008 | Dwyer et al. | |
| 7,443,163 B2 * | 10/2008 | Warntjes | G01R 33/3657 324/318 |
| 8,474,725 B2 * | 7/2013 | Kato | G06K 19/0723 235/487 |
| 8,937,576 B2 * | 1/2015 | Dokai | H01Q 1/2225 343/749 |
| 8,947,302 B2 * | 2/2015 | Caballero | H01Q 1/243 343/702 |
| 2005/0099341 A1 * | 5/2005 | Zhang | H01Q 1/273 343/700 MS |
| 2013/0147679 A1 * | 6/2013 | Jeng | H01Q 1/243 343/860 |
| 2014/0078010 A1 | 3/2014 | Li et al. | |

OTHER PUBLICATIONS

Chang et al., "Physical Characteristics of Polyimide Films for Flexible Sensors", Applied Physics A Materials Science & Processing, vol. 92, No. 3, 2008, pp. 693-701.

Cooke, "Self-inductance of the elliptical loop", Proceedings of the Institution of Electrical Engineers. vol. 110. No. 7. IET Digital Library, 1963.

Huang et al., "Epidermal Radio Frequency Electronics for Wireless Power Transfer", Microsystems & Nanoengineering, vol. 2, No. 1, Oct. 24, 2016, pp. 1-9.

Huang et al., "Epidermal Radio Frequency Electronics for Wireless Power Transfer—Supplementary File", Microsystems & Nanoengineering, vol. 2, No. 1, 2016, 12 pages.

Igreja et al., "Analytical evaluation of the interdigital electrodes capacitance for a multi-layered structure", Sensors and Actuators A: Physical 112.2-3 (2004): 291-301.

Jow et al., "Design and optimization of printed spiral coils for efficient transcutaneous inductive power transmission", IEEE Transactions on biomedical circuits and systems 1.3 (2007): 193-202.

International Application No. PCT/US2018/066492 , "International Search Report and Written Opinion", dated Apr. 1, 2019, 15 pages.

* cited by examiner

VARIABLE IMPEDANCE MATCHING NETWORKS FOR STRETCHABLE ANTENNAS

CROSS-REFERENCE TO RELATED APPLICATIONS

This application claims priority to U.S. Provisional Application No. 62/608,833, filed Dec. 21, 2017, entitled "Variable Impedance Matching Networks For Stretchable Antennas," which is hereby incorporated by reference in its entirety herein.

FIELD

The present disclosure relates to variable impedance matching networks for stretchable antennas.

BACKGROUND

Wireless devices can use antennas to transmit and receive radio frequency ("RF") information to other devices. To efficiently communicate using an antenna, an RF transmitter (or receiver) may be connected to the antenna via electronic components arranged to match an impedance between the RF transmitter and the antenna. Such arrangements may be referred to as "matching networks" or "impedance matching networks." If a matching network is not used, or the RF transmitter's impedance does not otherwise match the antenna's impedance, some of the power transmitted by the RF transmitter to the antenna may be lost or signal reflection may occur, resulting in reduced performance.

SUMMARY

Various examples are described for variable impedance matching networks for stretchable antennas. One example device includes a flexible substrate configured to flex in at least an X dimension and a Y dimension, wherein the X and Y dimensions are orthogonal and coplanar with a surface of the flexible substrate; an antenna formed on the flexible substrate, the antenna deformable in at least one of the X or Y dimensions, wherein an inductance ("$L_A$") of the antenna varies based on a flexing of the flexible substrate in the at least one of the X or Y dimensions, an impedance matching network formed on the flexible substrate and coupled to the antenna, the impedance matching network deformable in the at least one of the X or Y dimensions, and wherein a capacitance ("$C_M$") or inductance ("$L_M$") of the impedance matching network is configured to vary (i) based on the flexing of the flexible substrate in the at least one of the X or Y dimensions and a separation between two portions of the impedance matching network, and (ii) in proportion to the varying of $L_A$ to maintain a substantially constant impedance of the combination of the impedance matching network and the antenna.

One example method for providing a variable impedance matching network may include determining an inductance ("$L_A$") for an antenna; determining an expected range of strains for the antenna based on predetermined a flexible substrate, the flexible substrate configured to flex in at least an X dimension and a Y dimension, wherein the X and Y dimensions are orthogonal and coplanar with a surface of the flexible substrate; determining changes in L based on the expected range of strains on the flexible substrate; determining a configuration of an impedance matching network based on the determined changes in L and the expected range of strains, wherein a capacitance ("$C_M$") or an inductance ("$L_M$") of the impedance matching network is configured to vary (i) based on a flexing of the flexible substrate in the at least one of the X or Y dimensions, and (ii) in proportion to the determined changes in $L_A$ to maintain a substantially constant impedance of the combination of the impedance matching network and the antenna; forming the antenna on a flexible substrate; forming the impedance matching network on the flexible substrate, the impedance matching network having the determined configuration; and coupling the antenna to the impedance matching network.

These illustrative examples are mentioned not to limit or define the scope of this disclosure, but rather to provide examples to aid understanding thereof. Illustrative examples are discussed in the Detailed Description, which provides further description. Advantages offered by various examples may be further understood by examining this specification.

BRIEF DESCRIPTION OF THE DRAWINGS

The accompanying drawings, which are incorporated into and constitute a part of this specification, illustrate one or more certain examples and, together with the description of the example, serve to explain the principles and implementations of the certain examples.

DETAILED DESCRIPTION

Figure 1:
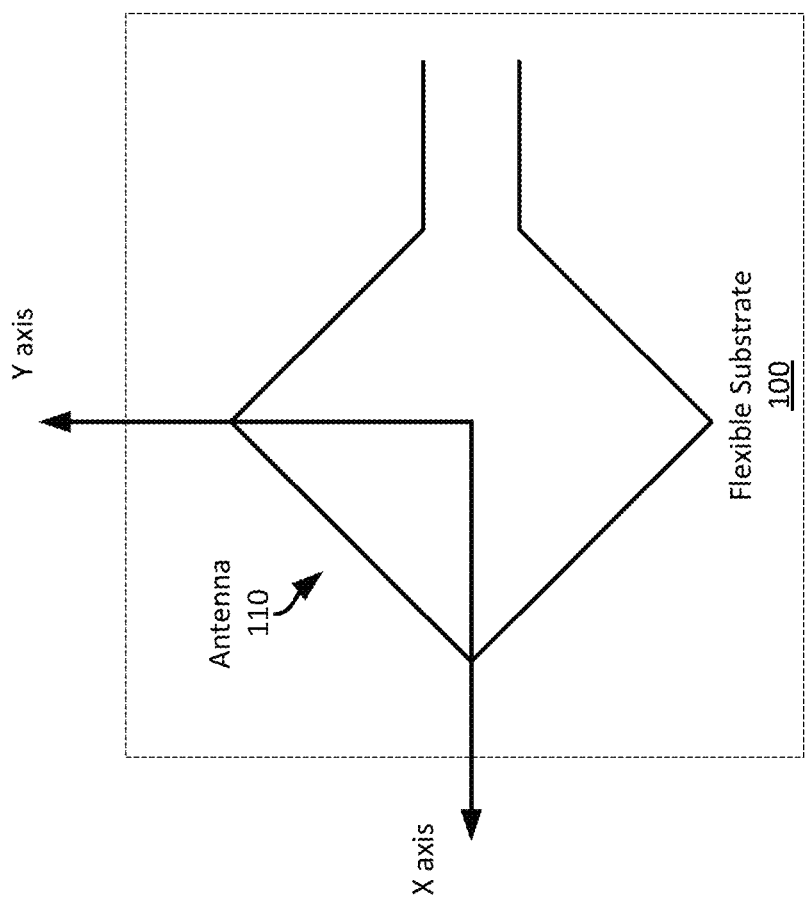
FIG. 1 shows an example loop antenna on a flexible substrate.

Examples are described herein in the context of variable impedance matching networks for stretchable antennas. Those of ordinary skill in the art will realize that the following description is illustrative only and is not intended to be in any way limiting. Reference will now be made in detail to implementations of examples as illustrated in the accompanying drawings. The same reference indicators will be used throughout the drawings and the following description to refer to the same or like items.

In the interest of clarity, not all of the routine features of the examples described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another.

Wearable devices, including wearable or implantable medical devices, such as continuous glucose monitors or neural stimulators, may include one or more antennas to enable wireless communications between the wearable device and another device, such as a smartphone or handheld reader device. To provide a wearer with a more comfortable wearable device, a portion of the device that contacts the wearer's skin may be at least partially constructed of a flexible material that can flex as the wearer goes about their day. In some cases, an antenna may be affixed to such a flexible material and thus may also flex and deform in shape as the flexible material flexes and deforms.

However, because antenna performance can be sensitive to changes in the antenna's shape and size, the antenna's performance may be affected when it is flexed. In particular, the shape and size of the antenna may affect its inductance, and consequently its impedance. Thus, as the antenna changes shape and size, its impedance may change as well, and an impedance matching network used to match the antenna's impedance with other RF circuitry may be rendered partially ineffective as result.

To overcome this problem, an antenna formed on, or otherwise affixed to, a flexible material, such as a flexible printed circuit board ("PCB") material, may be connected to other RF circuitry via an impedance matching network that is also formed on the flexible material. In this example, the antenna is a loop antenna and is connected to an impedance matching network that includes an interdigital capacitor ("IDC"). An IDC is formed of two opposing wire traces, each of which having complementary protrusions to create complementary comb-like shapes. The IDC's capacitance is based on the size, shape, and thickness of the two wire traces and protrusions, as well as the gap between them. In this example, both the antenna and the IDC are formed on the flexible material. The IDC is formed on the flexible material by depositing two wire traces, including respective protrusions, on the flexible material. One of the wire traces connects the IDC to the antenna, while the other connects the IDC to other circuitry, such as a wireless transceiver.

When the flexible material later flexes, the antenna's shape changes, causing a change in its impedance as discussed above. However, because the IDC is formed directly on the flexible material, its shape will change as well. Because the IDC's capacitance is based on its shape, including the lengths of one or more of the protrusions and the spacing between the protrusions and respective wire traces, as the IDC changes shape, its capacitance changes as well. Thus, the IDC can be used as a variable capacitance that changes based on the amount of flex applied to the flexible material. Since both the IDC and the antenna are formed on the flexible material, their respective changes in shape, and consequent changes in electrical response, may substantial cancel each other, thereby maintaining a substantially constant impedance. As a result there is less variation in the antenna's efficiency as it flexes.

This illustrative example is given to introduce the reader to the general subject matter discussed herein and the disclosure is not limited to this example. The following sections describe various additional non-limiting examples and examples of systems and methods for variable impedance matching networks for stretchable antennas.

Figure 2:
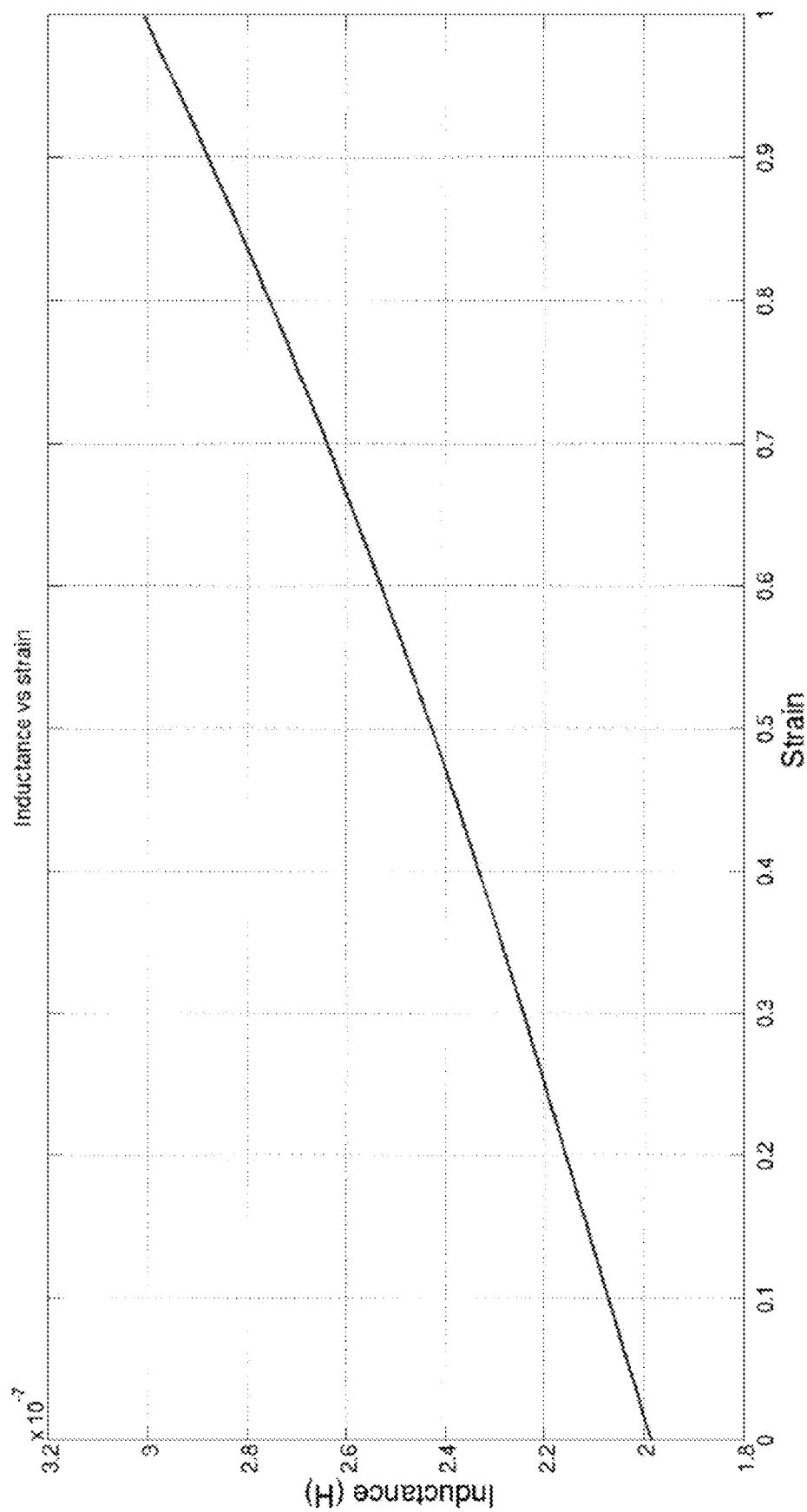
FIG. 2 shows a graph illustrating an inductance change in a modelled loop antenna as a result of mechanical strain.

Referring now to FIG. 1, FIG. 1 shows an example antenna 110 formed on a flexible substrate 100, such as a flexible PCB. In this example, the antenna 110 is a loop antenna with a radius of 5 millimeters ("mm") and a wire trace width of 1 mm using wires 1 mm thick, though any suitable antenna may be used. Because the loop antenna 110 is two-dimensional, it is susceptible to deformation in two degrees of freedom, labeled with the x- and y-axes. Deformation in a third dimension, the z-axis, can also occur as a result of stretching such that the antenna wire itself stretches and get thinner, though in many cases this deformation can be ignored. The orientation of these two (or three) axes is arbitrary so long as they are all orthogonal to each other. A loop antenna's inductance varies according to a change in the area within the loop. When the antenna 110 flexes, its shape and size, and therefore the area, changes, changing its inductance. The flex may happen in either or both degrees of freedom, resulting in various changes in the antenna's inductance. FIG. 2 shows a graph illustrating an example loop antenna's inductance changing as a function of strain in response to an applied flexing of the antenna. As can be seen, the antenna's inductance increases as the strain increases. A change in the antenna's inductance causes a corresponding change to the impedance presented to other circuitry, potentially reducing the antenna's efficiency, as discussed above.

Figure 3A:
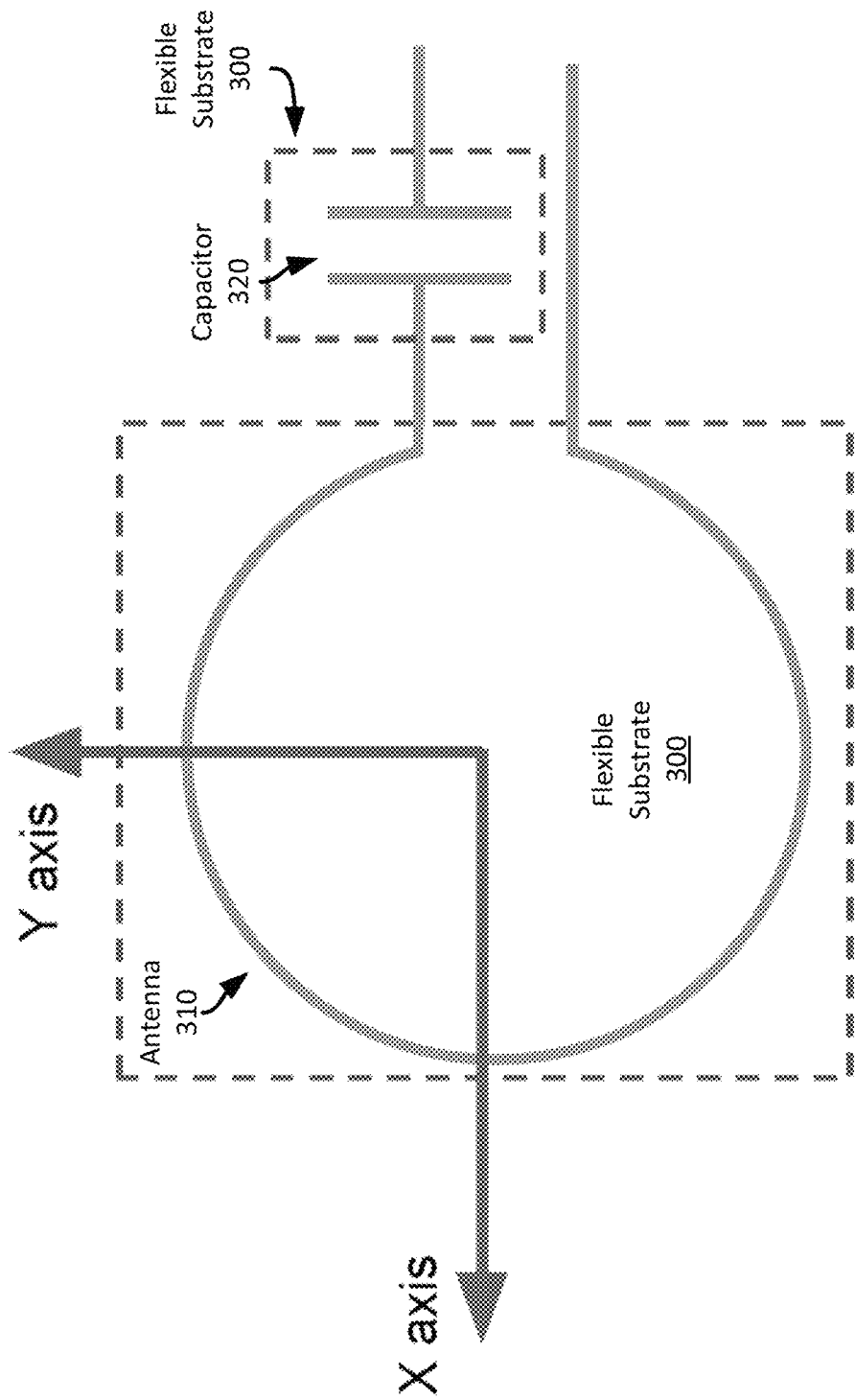
FIGS. 3A-3B shows an example loop antenna connected to an example variable impedance matching network on a flexible substrate.
Figure 3B:
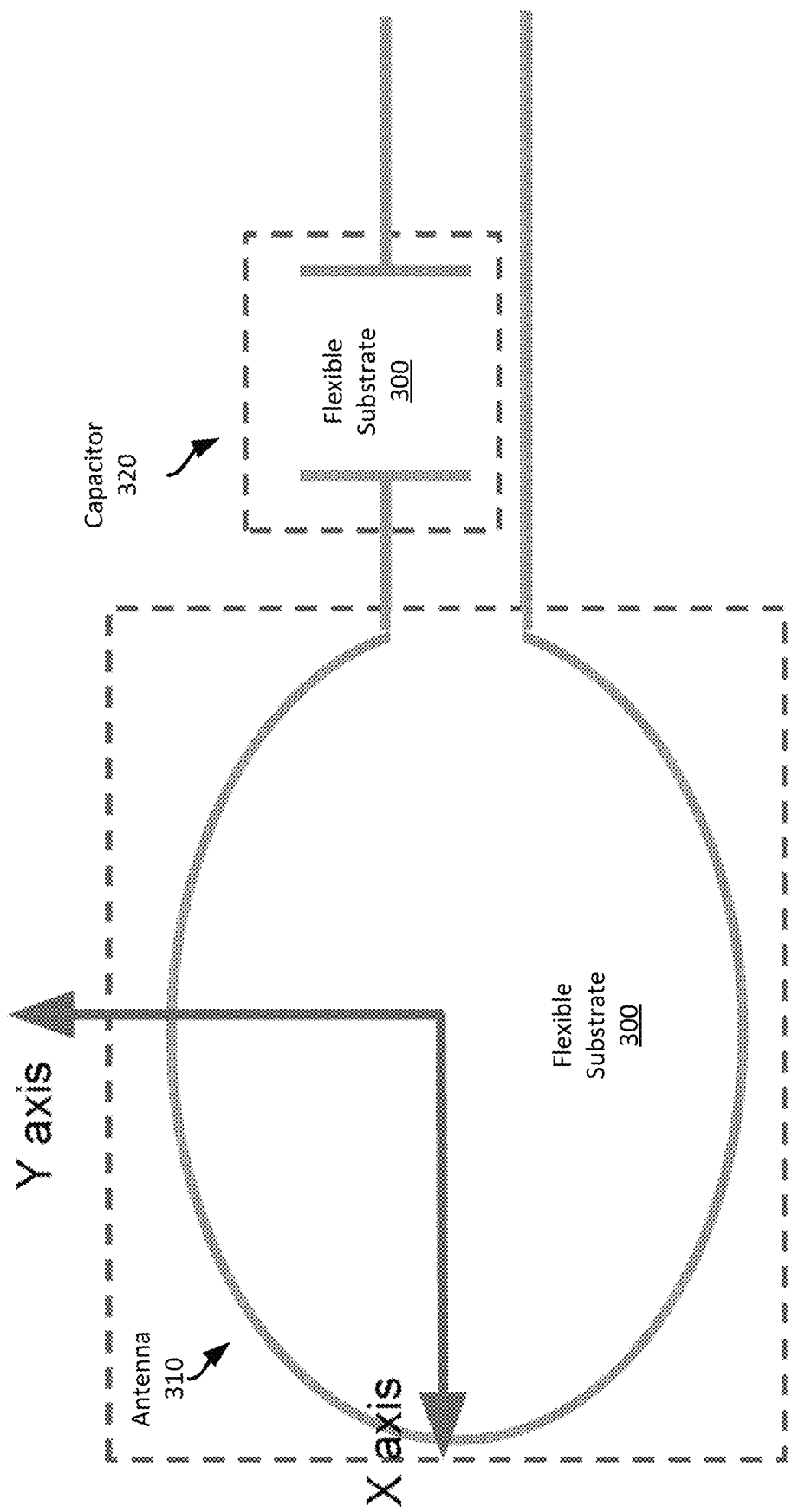

Referring now to FIGS. 3A-3B, FIG. 3A shows an example loop antenna 310 formed on (or otherwise affixed to) a flexible substrate 300. The antenna 310 is coupled to an impedance matching network that includes a capacitor 320 that is also formed on the flexible substrate 300. In FIG. 3A, both the antenna 310 and the capacitor 320 are at rest. The term "at rest" is used to refer to the antenna 310 and capacitor 320 when the flexible substrate 300 is not experiencing any deformation, and thus the antenna 310 and the IDC 320 are not deformed.

In this example, the capacitor 320 has been sized to match the antenna's impedance with other RF circuitry. Thus, at rest, each of these components has its designed at-rest inductance or capacitance, respectively.

FIG. 3B, however, illustrates the antenna 310 and the capacitor 320 when the flexible substrate 300 has been stretched in the X axis, thereby deforming both the antenna 310 and the capacitor 320. As can be seen, the size of the antenna 310 has changed due to the stretching, which has thereby changed the antenna's inductance. However, because the capacitor 320 is also formed on the same flexible substrate 300, the capacitor 320 also experiences a deformation in the X-axis, which increases the gap between the two wires of the capacitor 320, thereby reducing its capacitance. Thus, while the antenna's inductance increases, the capacitor's capacitance has decreased a similar amount, thereby helping to compensate for the inductance change and to reduce the impact on the circuit's impedance. In some examples, the capacitor may be designed to substantially eliminate any impedance change, though in some examples, the capacitor 320 may be designed to reduce an amount of impedance change below a predefined tolerance threshold.

While the example shown in FIGS. 3A-3B illustrate a stretch in one dimension using a single capacitor, other examples may be employed to compensate for stretching in another dimension or in multiple dimensions, including stretching, bending, or and flexing.

Figure 4A:
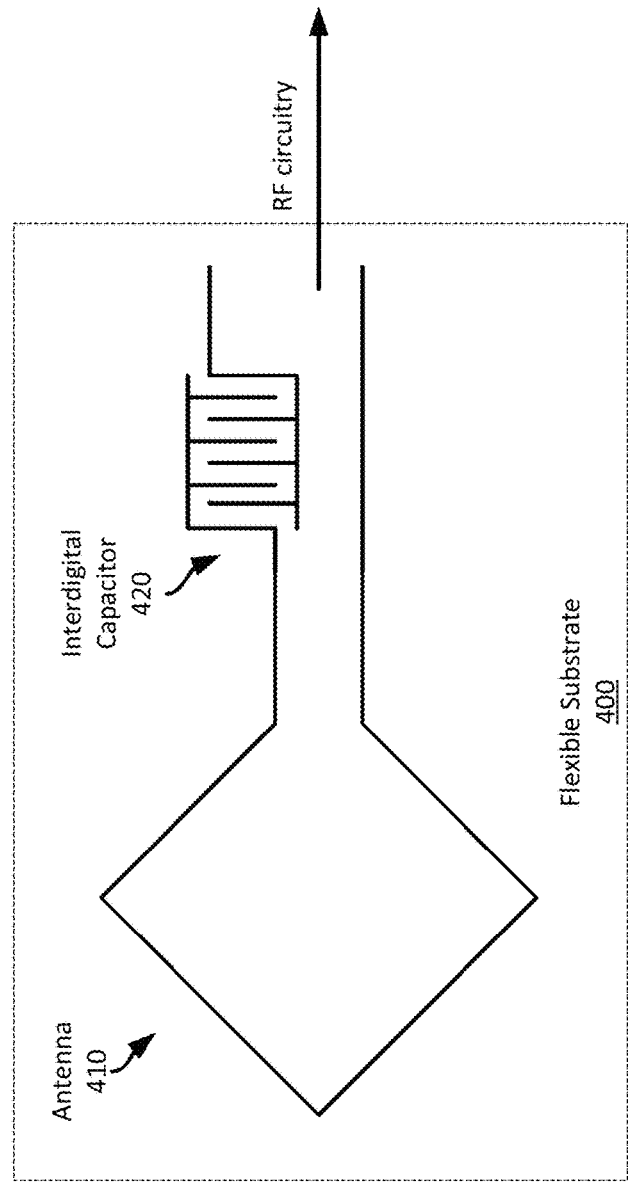
FIGS. 4A-4B shows an example loop antenna connected to another example variable impedance matching network on a flexible substrate.

Referring now to FIG. 4A, FIG. 4A shows an example antenna 410 (having the same configuration as the antenna 110 of FIG. 1) coupled to impedance matching that includes an IDC 420, both of which are formed on a flexible substrate 400. The antenna 410 is a loop antenna in this example, and the IDC 420 provides a capacitance, which in combination with the antenna's inductance, provides an impedance to other radio frequency ("RF") circuitry, such as a transceiver. In general, the impedance of the combination of the antenna 410 and the IDC 420 (at rest) will be selected to match an impedance of such RF circuitry to provide efficient power transfer and reduce signal reflections within the antenna 410 or circuitry. In other words, the impedance matching enables efficient use of the antenna 410 by the RF circuitry.

Once a desired impedance is determined, the antenna's inductance and the IDC's capacitance can be designed accordingly. The IDC's capacitance can be established using known design techniques, and can be based on the length and number of protrusions within the IDC 420 as well as a gap between the two portions of the IDC 420, as well as by the substrate material, or other dielectric material, within the gap. However, because both the antenna 410 and the IDC 420 are expected to deform as the flexible substrate 400 flexes, the expected amount of deformation of each can be used to appropriately design the IDC 420 to counter deformation of the antenna 410, including the size (width and length) and number of protrusions, the gap between the protrusions, etc. Specifically, as the antenna's inductance increases due to flexing of the substrate 400, the IDC's capacitance should decrease.

Figure 4B:
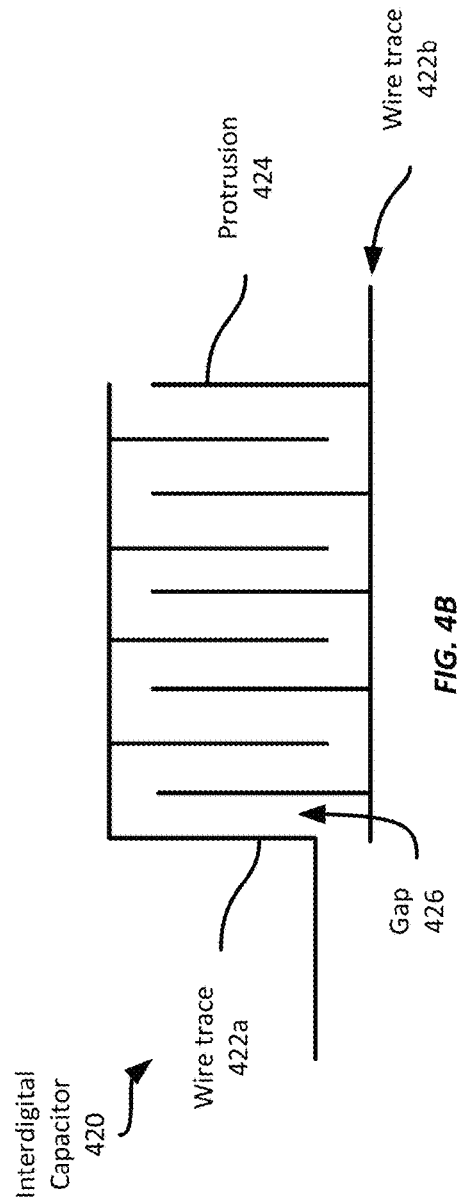
Figure 5:
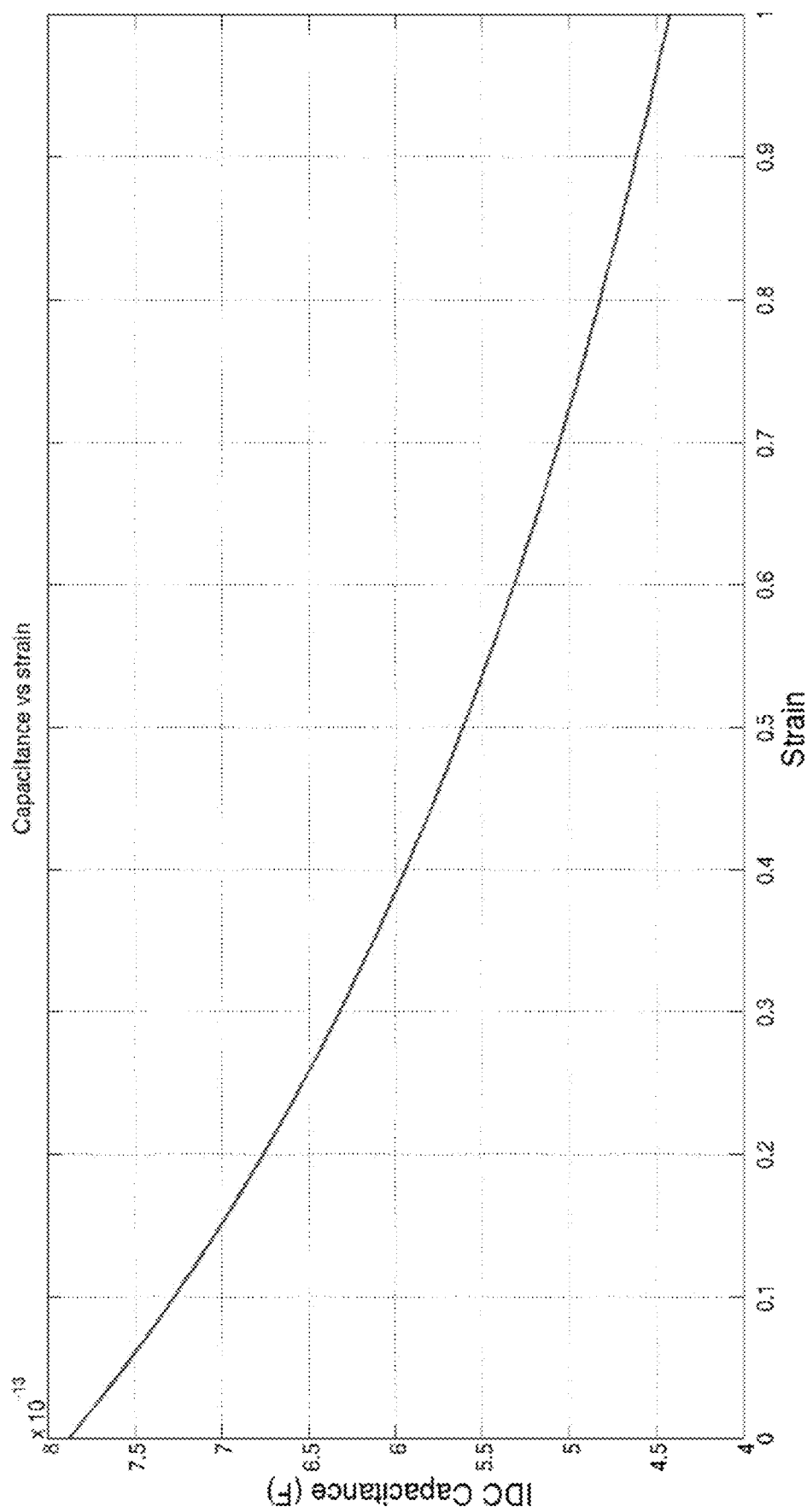
FIG. 5 shows a graph illustrating a capacitance change in an interdigital capacitor as a result of mechanical strain.

FIG. 4B shows the IDC 420 shown in FIG. 4A. This example IDC 420 includes two wire traces 422a-b, each with five protrusions 424 (or "fingers"). The wire traces, including the protrusions, have a width of 1.1 millimeters ("mm") The protrusions 424 are each 5 mm long and the gap 426 is 2 mm. FIG. 5 illustrate the changes in capacitance of the example IDC 420 shown in FIGS. 4A-4B as the IDC 420 responds to deformation. As can be seen, and in contrast to the inductance change shown in FIG. 2, the capacitance decreases as the IDC is deformed. For example the deformation may increase the size of the gap 426 between protrusions 424, or may increase the length of the wire traces 422a-b or protrusions 424, thereby reducing the capacitance. This is in contrast to a matching network constructed from discrete electronic components soldered to a PCB whose electrical properties do not change as the flexible substrate flexes.

Figure 6:
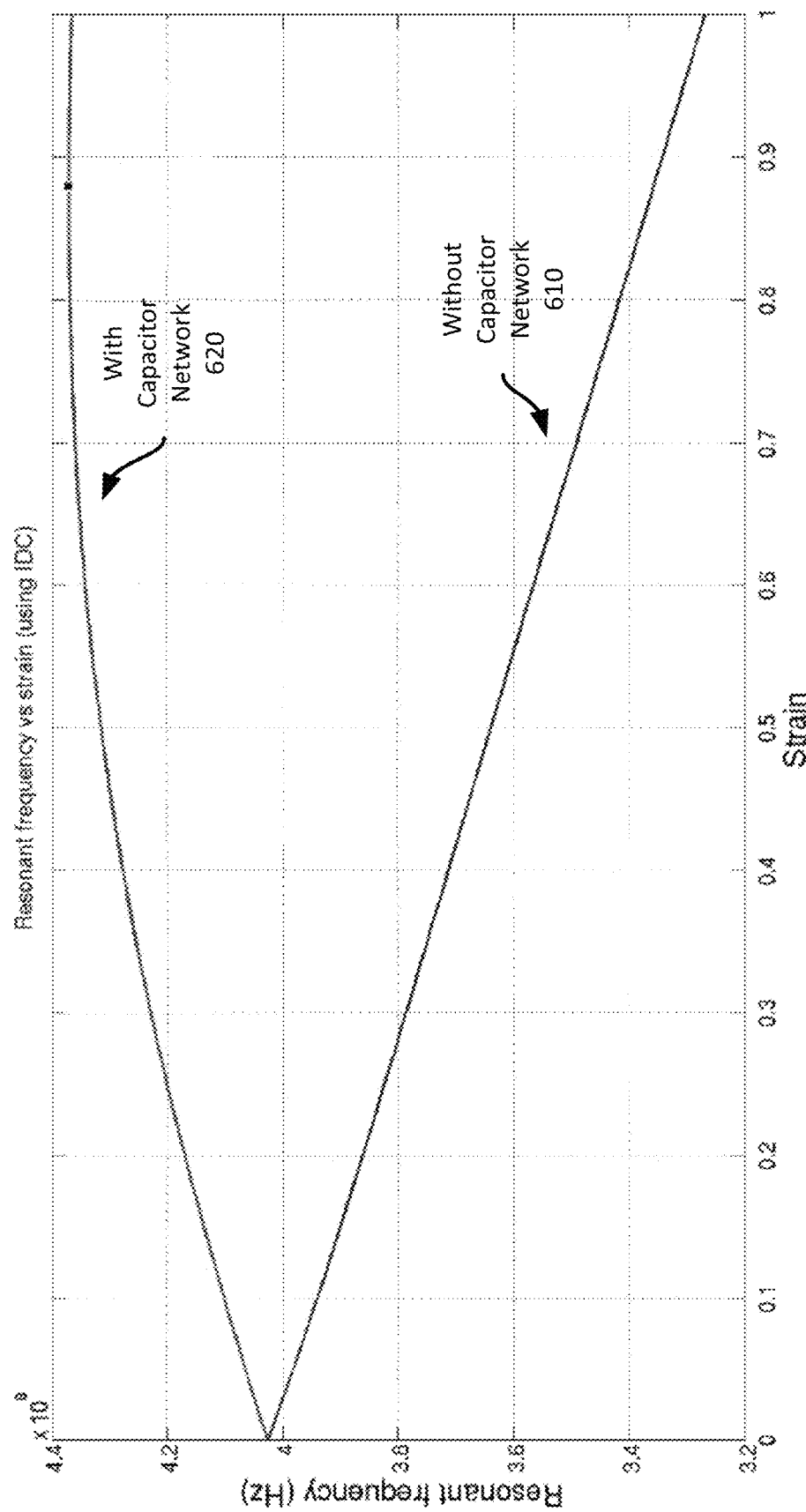
FIG. 6 shows a graph illustrating resonant frequency changes in an example modelled loop antenna as a result of mechanical strain.

FIG. 6 shows a graph illustrating how the antenna's resonant frequency changes as a result of deformation. The first plot 610 illustrates the impact on resonant frequency as the antenna 410 shown in FIG. 4A experiences increasing amounts of strain. As can be seen, the resonant frequency decreases from approximately 402 megahertz ("MHz"), the frequency at which communications are to be conducted, to approximately 325 MHz with increasing strain, a change of approximately 19%. This will likely result in significantly reduced efficiency.

The second plot 620 illustrates the change in resonant frequency of the antenna 410 shown in FIG. 4A in conjunction with the IDC 420 as both experience strain. As can be seen, the change in resonant frequency is significantly less due to the change in capacitance of the IDC 420 as it experiences strain. In this example, the resonant frequency increases from approximately 402 MHz to a maximum of approximately 435 MHz, a change of approximately 8%. In addition, as can be seen in the first plot 610, the change in resonant frequency is approximately linear, thus, as strain increases, resonant frequency continues to decrease at a substantially constant rate. However, in the second plot 620, the resonant frequency increases to approximately 430 MHz at 0.5 strain, approximately 7%, but then only slightly increases to a maximum of 435 MHz at approximately 0.875 strain, an additional increase of only about 1%, before beginning to decrease again. Thus, the example shown in FIG. 4A is both less affected by flexing overall than the system in FIG. 1, but also tolerant of significant flex or deformation (e.g., when strain >0.5).

Figure 7:
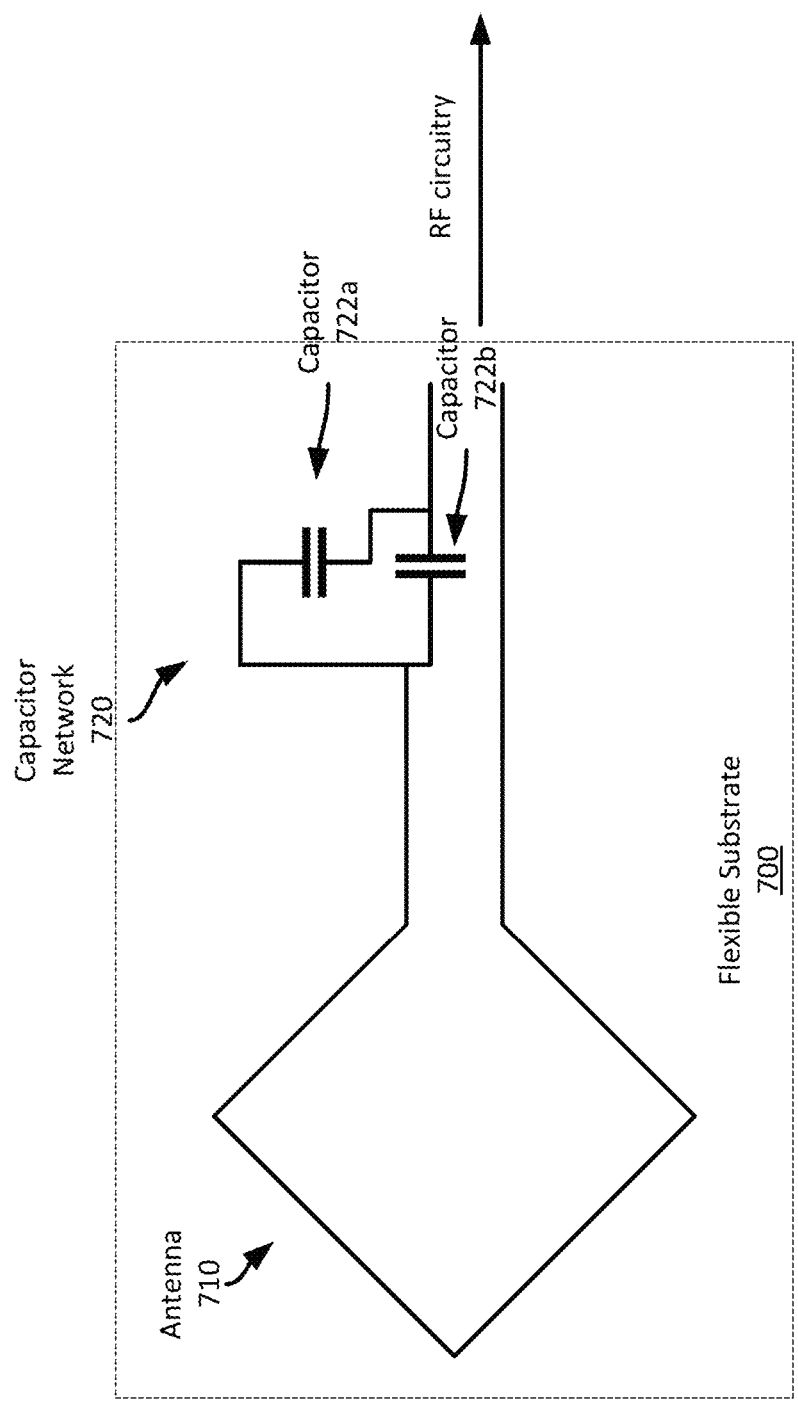
FIGS. 7-8 show example loop antennas connected to example variable impedance matching networks on a flexible substrate.

Referring now to FIG. 7, FIG. 7 shows an example antenna 710 and impedance matching network 720 formed on a flexible substrate 600. In this example, the antenna is again a loop antenna. However, the impedance matching 720 in this example includes two capacitors 722a-b formed on the flexible substrate. Each capacitor 722a-b is formed by two wires separated by a gap. However, the capacitors 722a-b are formed such that the wires forming one capacitor 722a are orthogonal to the wires forming the other capacitor 722b. Thus, each capacitor 722a-b is designed so that the gap between its wires changes in response to flex in a direction orthogonal to the other, thereby allowing the impedance matching to change its capacitance, due to a change in the width of the gap for a respective capacitor, based flexing of the substrate in one or two degrees of freedom. Capacitance also changes based on the length of the respective wires, thus, each capacitor 722a-b will change capacitance irrespective of the direction of the flexing; however, because each of these quantities can be accounted for, sizing the respective capacitors for a particular application can be accomplished according to known equations defining the capacitance of a parallel-plate capacitor.

Figure 8:
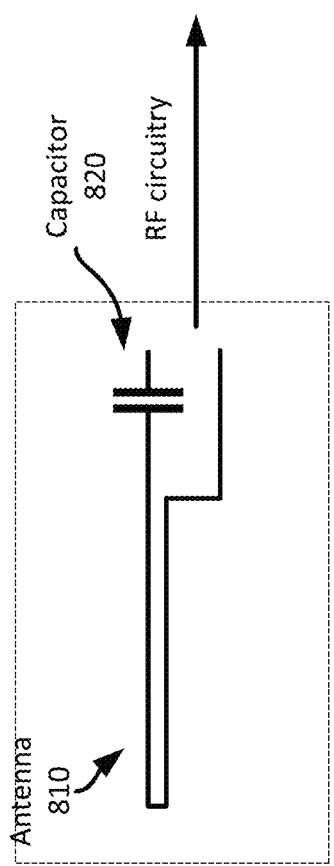

Similar principles as those discussed above can be used to accommodate flexing of other types of antennas. For example, FIG. 8 shows a substantially one-dimensional antenna with a length significantly greater than its width. In this example, a single parallel-plate capacitor 820 is formed on the flexible substrate to compensate for changes in the length of the antenna. It should be appreciated, however, that the capacitor 820 may be oriented to compensate for changes in the width of the antenna, or an impedance matching having two capacitors 820, such as shown in FIG. 6, may be employed instead.

Figures 9A, 9B:
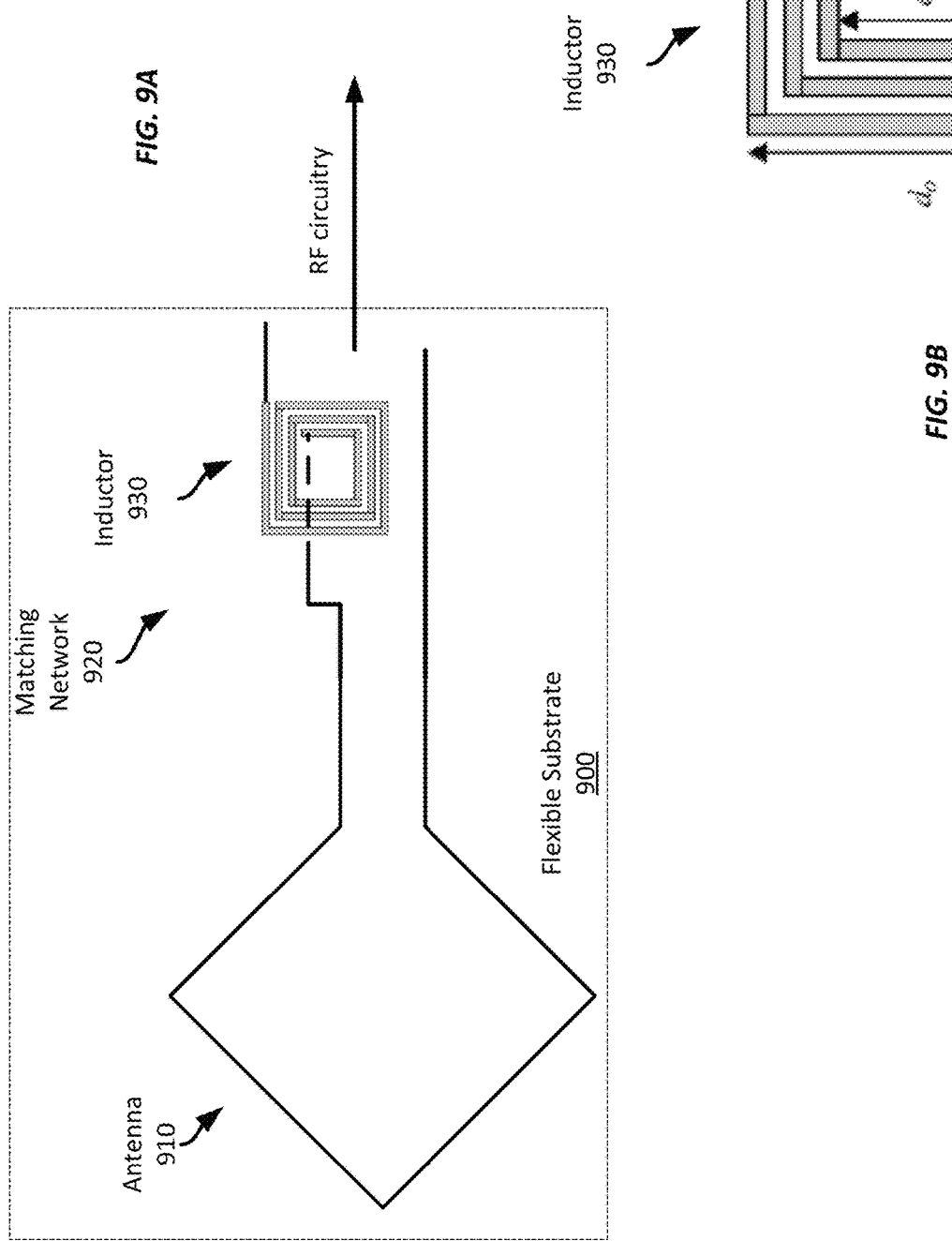
FIGS. 9A-9B and 10 show example loop antennas connected to an example variable impedance matching networks on a flexible substrate.

Referring now to FIG. 9A, FIG. 9A shows an example antenna 910 and impedance matching network 920 formed on a flexible substrate 900. In this example, the impedance matching network 920 includes an inductor 930 having a flattened coil shape. The inductor 930 is formed on the flexible substrate substantially described as above. As discussed above with respect to capacitors and antennas, the inductance of the inductor 930 may change as the flexible substrate flexes, thereby changing the size and shape of the inductor 930. In this example, the coil shape of the inductor 930 allows for stretching or flexing in two DOFs, though as discussed above, the thickness of the metals trace defining the inductor may change as the inductor is flexed or stretched, further affecting its inductance.

An inductance of such a coil inductor may be established based on various physical parameters of the inductor. Physical parameters of the inductor 930 are shown in FIG. 9B. The inductance ("L") of the inductor 930 may be determined according to the following equations:

$$L = \frac{1.27 \cdot \mu_0 n^2 d_{avg}}{2}\left[\ln\left(\frac{2.07}{\varphi}\right) + 0.18\varphi + 0.13\varphi^2\right]$$

$$\varphi = \frac{d_o - d_i}{d_o + d_i}$$

$$d_{avg} = \frac{d_o}{d_i}$$

Thus, as the inductor experiences strain, the value of $d_{avg}$ will increase, increasing the inductance, L, of the inductor 930.

While in the example shown in FIG. 9A, the inductor 930 is formed as a coil, any suitable shape may be employed. Further, while only one inductor 930 is employed in this example, any suitable number of inductors may be employed according to different examples. Thus, as can be seen in FIG. 9, impedance matching networks according to this disclosure may employ inductors rather than capacitors to provide impedance matching between an antenna and RF circuitry using the antenna to transmit or receive RF signals.

Figure 10:
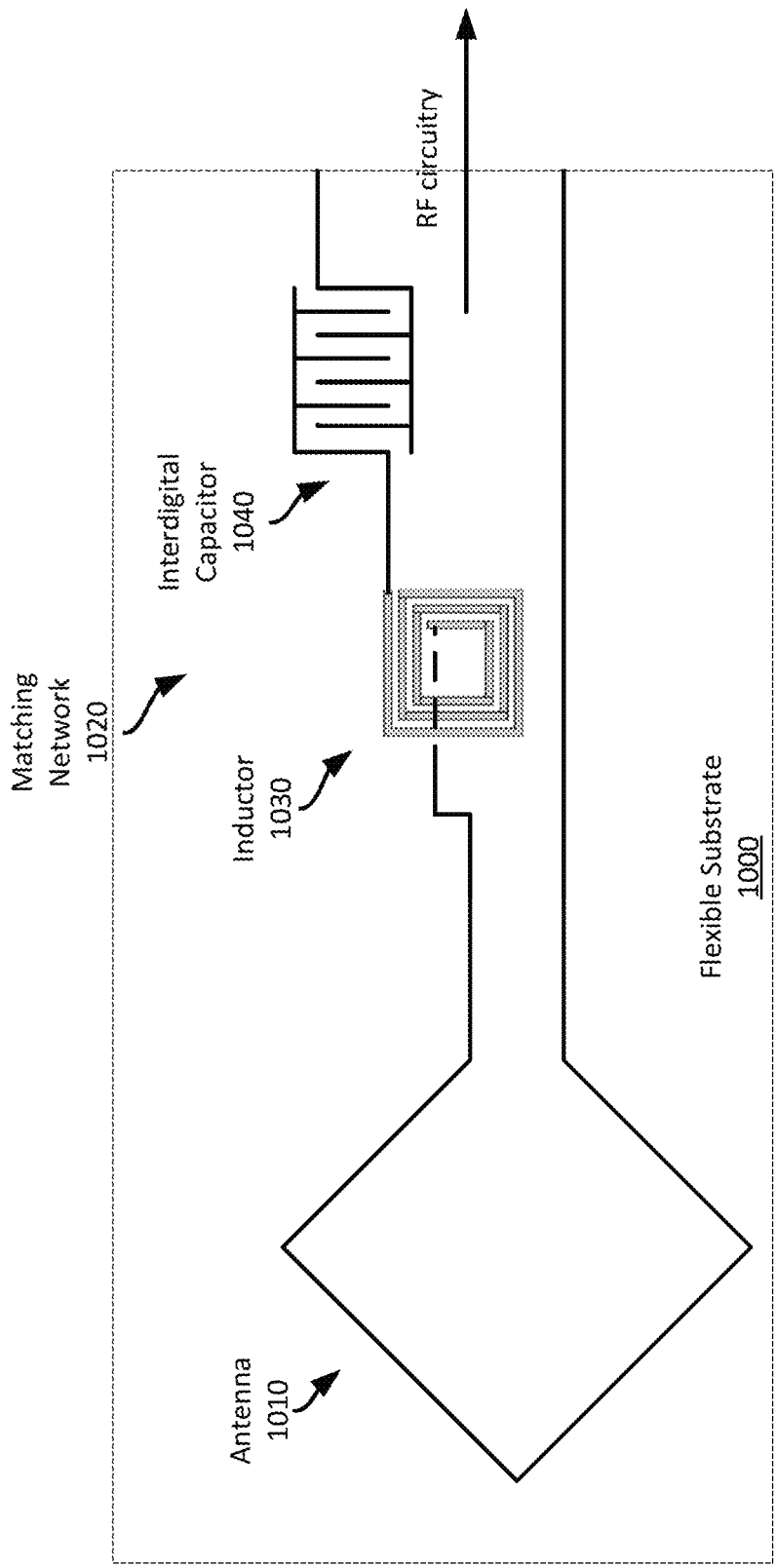

Referring now to FIG. 10, FIG. 10 shows an example antenna 910 and impedance matching network 1020 formed on a flexible substrate 1000. In this example, the impedance matching network 1020 includes both an inductor 1030 and an IDC 1040 formed on the flexible substrate 1000. Thus, as the flexible substrate flexes, the impedance of the impedance matching network 1020 may change to maintain a substantially constant impedance for the RF circuitry using the antenna 1010 to transmit or receive RF signals generally as discussed above. The embodiment shown in FIG. 10 illustrates another example impedance matching network 1020 that combines both capacitors and inductors. And while this example includes a coil inductor 1030 and an IDC 1040, any suitable type and number of inductors or capacitors may be employed.

Figure 11:
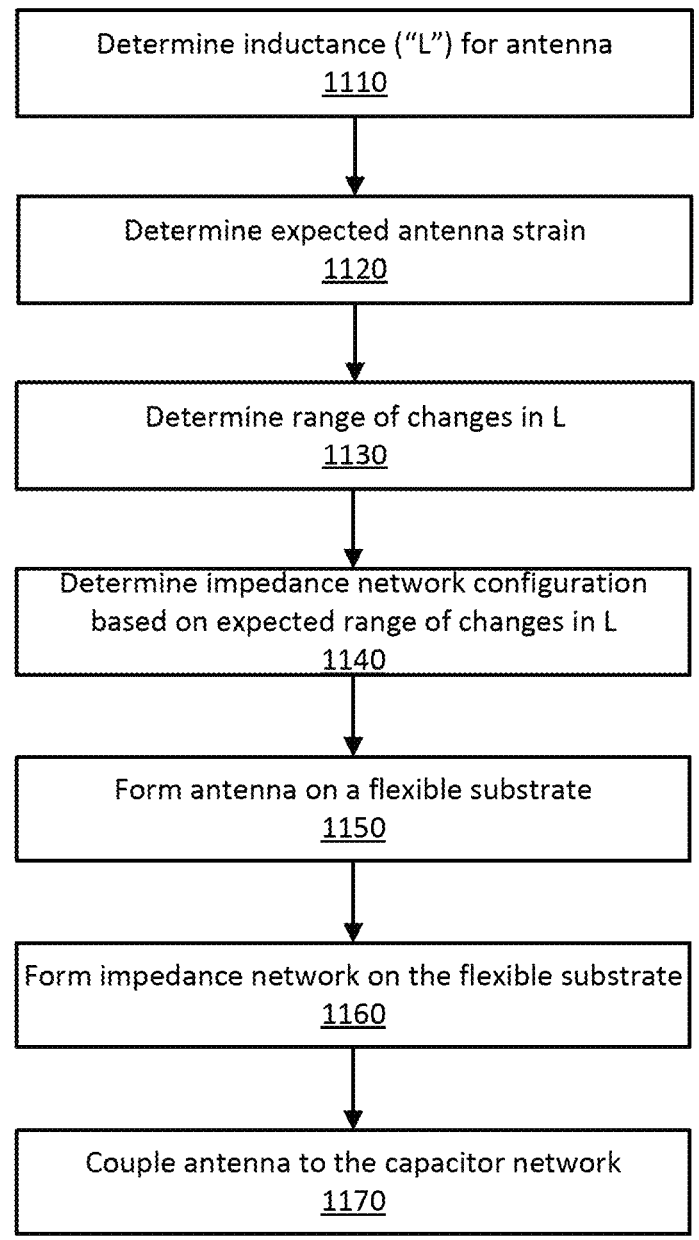
FIG. 11 shows an example method for providing variable impedance matching networks for stretchable antennas.

Referring now to FIG. 11, FIG. 11 shows a method 1100 for variable impedance matching networks for stretchable antennas. The discussion of the example method 1100 will be made with respect to the example antenna 410 and IDC 420 shown in FIGS. 4A-4B, but it should be appreciated that the method may be employed with respect to any suitable antenna and variable impedance matching network according to this disclosure, such as shown in FIGS. 3A-3B, or 7-10.

At block 1110, an inductance ("$L_A$") for the antenna 410 is determined. In this example, the inductance is determined while the antenna is at rest, though the inductance may also be measured at various amounts of strain, as will be discussed in more detail below. Antenna inductance may be determined according to any suitable technique. For example, the inductance may be determined mathematically according to a design, e.g., based on a size and shape, of the antenna 410. In some examples, the antenna may be measured using an electronic device, such as an impedance meter. In some examples, antennas 410 may be coil antennas having diameters between substantially 1 mm and 1 centimeter ("cm"). However, any suitable size or shape may be employed for an antenna.

At block 1120, a range of strains for the antenna 410 is determined based on a predetermined flexible substrate. In this example, the flexible substrate 400 is a flexible PCB having a polyimide composition, but may be any suitable flexible substrate may be employed, such as silicones, polyesters, PEEKs (polyether ether ketone), etc. Such flexible substrates 400 have well-known flex characteristics that can be modelled or measured based on a particular application. A range of strains may be determined based on an expected range of flexing of the flexible substrate in a particular application. For example, a medical device affixed to a wearer's chest may experience flexion of 10-20% in two dimensions as the wearer breathes. In some examples, the substrate may experience more significant amounts of flexion, including stretching up to 100% in one or more DOFs. Such range of strains may be determined based on an expected application for the antenna and associated device.

At block 1130, change in the antenna's inductance ("ΔL") over the range of strains is determined. The change in inductance may be measured as the antenna is stretched in one or more DOFs. In some examples, the change in inductance may be modelled. For example, the graph shown in FIG. 2 illustrates a modelled change in inductance over a range of strains.

At block 1140, a configuration for an impedance matching network is determined based on the change in the antenna's inductance. In this example, the impedance matching network is configured to vary in capacitance ("C") based on flexion of the flexible substrate and to vary in proportion to the determined ΔL to maintain a substantially constant value for L*C as the substrate flexes. In some examples, "substantially constant" may be established within a tolerance threshold. For example, a tolerance of a 10% variation in the value of L*C as the flexible substrate may be established in some examples. However, the tolerance may be established based on system requirements, such as efficiency requirements, a maximum transmit power, a communications range, etc.

In one example, a type of capacitor or capacitors is determined. For example, one or more parallel-plate style capacitors may be employed. An example parallel-plate capacitor 320 is shown in FIGS. 3A-3B. As shown in the example of FIG. 7, multiple parallel-plate capacitors 722*a-b* may be employed, each oriented along one DOF. In this example, the configuration for the impedance matching network is the IDC 420 shown in FIGS. 4A-4B.

Capacitance ("C") for an IDC may be calculated based on the lengths of the wire traces 422*a-b* and the protrusions 424 as well as the gap 426 between the protrusions 424 and wire trace 422*a-b*. Such a capacitance may be determined or modelled as described in Igreja, Rui, and C. J. Dias. "Analytical evaluation of the interdigital electrodes capacitance for a multi-layered structure." *Sensors and Actuators A: Physical* 112.2: 291-301, 2004. Thus, a configuration of an IDC may be determined by selecting a number of protrusions, the width of the protrusions, a length of the wire traces or protrusions, a gap between protrusions and associated wire traces, etc. In addition, material properties may be determined, such as a conductive materials, e.g., copper, and a thickness of such a material. For example, a thickness of the conductive material may help determine an amount of shape change due to strain of the impedance matching network. Further, an IDC configuration may be selected based on the range of strains determined at block 1130. For example, if ΔL in a first DOF is twice the ΔL in a second DOF based on the range of strains, the IDC may be designed to achieve a larger change in capacitance ("ΔC") in the first DOF than the second DOF. Further, when stretched or flexed, the conductive material may stretch and get thinner at a particular location, which may provide a second or third DOF. Thus, a thickness of one or more portions of the IDC (or other capacitor types) may be selected based on the range of strains determined at block 1130.

In some examples, as discussed above, the impedance matching network may include one or more parallel-plate capacitors. The capacitor(s) may be oriented to change in capacitance based on flexion of the flexible substrate. For example, a capacitor may be oriented such that flexion or stretching in a DOF increases a gap between the two plates by orienting the plates orthogonally to the DOF. Such an orientation may reduce the capacitance of the capacitor when stretched because capacitance decreases in proportion to the increase in the gap. Thus, to accommodate two DOFs, two capacitors may be employed, one oriented with respect to each of the respective DOFs, such as shown in FIG. 7. And while the example in FIG. 7 employs two capacitors, any suitable number of capacitors may be employed. Thus, the capacitor(s) may vary in capacitance in two or more DOFs.

As discussed above with respect to FIGS. 9A-9B and 10, an impedance matching network may employ one or more inductors. Thus, at block 1140, in some examples, an inductance ("$L_M$") may be configured to change based on a flexing or stretching of the flexible substrate to compensate for expected changes in the antenna's inductance to provide a substantially constant impedance to other RF circuitry. Further, the impedance matching network may include both capacitive and inductive elements, which may be selected as discussed above to compensate for expected changes in the antenna's inductance to provide a substantially constant impedance to other RF circuitry.

At block 1150, the antenna 410 is formed on the flexible substrate. In this example, a wire trace is deposited on the flexible substrate according to the determined shape and size of the antenna. In some examples, the inductance of the antenna may be measured, as discussed above with respect to block 1110, after it has been formed.

At block 1160, the impedance matching network is formed on the flexible substrate. In this example, the wire traces and protrusions of the IDC 420 are formed by depositing a conductive metal, e.g., copper, on the flexible substrate. While a conductive metal is employed in this example, any suitable conductive material may be employed. Further, in this example, no dielectric material is deposited on the flexible substrate; however, in some examples, a dielectric material may be deposited within a gap between the electrodes of the capacitor, or a portion of the flexible material may be cut away, e.g., by laser cutting, to provide air as a dielectric material between the two conductors of the capacitor. While this example employs an IDC, any suitable capacitor (or capacitors) may be formed on the flexible material, including parallel-plate capacitors, such as those shown in FIGS. 7-8. Further, examples, such as shown in FIGS. 9A and 10 may include one or more inductors that may be formed on the flexible substrate.

At block 1170, the antenna is coupled to the impedance matching network. In this example, a metal trace is deposited on the flexible material to couple the antenna 410 to the IDC 420. In other examples, a metal trace may be deposited on the flexible material to couple the antenna 410 to an impedance matching network formed of one or more capacitors or one or more inductors.

While the method 1100 shown in FIG. 11 has been described as being performed in a particular order, not such order should be implied by the Figure or the description. Instead, the steps may be performed in any suitable order. For example, block 1150 may be performed before block 1110 such that the antenna is formed and then its inductance measured. Still further variations may be employed according to different examples.

The foregoing description of some examples has been presented only for the purpose of illustration and description and is not intended to be exhaustive or to limit the disclosure to the precise forms disclosed. Numerous modifications and adaptations thereof will be apparent to those skilled in the art without departing from the spirit and scope of the disclosure.

Reference herein to an example or implementation means that a particular feature, structure, operation, or other characteristic described in connection with the example may be included in at least one implementation of the disclosure. The disclosure is not restricted to the particular examples or implementations described as such. The appearance of the phrases "in one example," "in an example," "in one implementation," or "in an implementation," or variations of the same in various places in the specification does not necessarily refer to the same example or implementation. Any particular feature, structure, operation, or other characteristic described in this specification in relation to one example or implementation may be combined with other features, structures, operations, or other characteristics described in respect of any other example or implementation.

Use herein of the word "or" is intended to cover inclusive and exclusive OR conditions. In other words, A or B or C includes any or all of the following alternative combinations as appropriate for a particular usage: A alone; B alone; C alone; A and B only; A and C only; B and C only; and A and B and C.

That which is claimed is:

1. A wearable device comprising:
a flexible substrate configured to flex in at least an X dimension and a Y dimension, wherein the X and Y dimensions are orthogonal and coplanar with a surface of the flexible substrate;
an antenna formed on the flexible substrate, the antenna deformable in at least one of the X or Y dimensions associated with a respective X or Y axis, wherein an inductance ("$L_A$") of the antenna varies based on a flexing of the flexible substrate in the at least one of the X or Y dimensions;
an impedance matching network formed on the flexible substrate and coupled to the antenna, the impedance matching network deformable in the at least one of the X or Y dimensions, the impedance matching network comprising one or more circuit components oriented parallel to one of the X or Y axis; and
wherein a capacitance ("$C_M$") or inductance ("$L_M$") of the impedance matching network is configured to vary (i) based on the flexing of the one or more circuit components in the X or Y axis, and (ii) in proportion to the varying of $L_A$ based on flexing in the X or Y axis to maintain a substantially constant impedance of the combination of the impedance matching network and the antenna.

2. The wearable device of claim 1, wherein the antenna is deformable in both of the X and Y dimensions, the impedance matching network further comprising one or more circuit components oriented parallel to the other of the X or Y axis, and wherein $C_M$ or $L_M$ is further configured to vary based on the flexing of the impedance matching network in both of the X or Y dimensions.

3. The wearable device of claim 2, wherein the antenna is a loop antenna or a near-field communication antenna.

4. The wearable device of claim 1, wherein the antenna is deformable in substantially only one of the X or Y dimensions, the one or more circuit components oriented parallel to the X or Y axis corresponding to the substantially only one of the X or Y dimensions.

5. The wearable device of claim 1, wherein the impedance matching network comprises first and second metal traces configured as an interdigitated capacitor.

6. The wearable device of claim 1, wherein the impedance matching network comprises a parallel plate capacitor formed on the flexible substrate, the parallel plate capacitor comprising two substantially parallel electrical traces formed on the flexible substrate, and wherein aligning the parallel plate capacitor with one of the X or Y axis comprises orienting the two substantially parallel electrical traces in parallel with the one of the X or Y axis.

7. The wearable device of claim 6, wherein the parallel plate capacitor is a first parallel plate capacitor, and wherein the impedance matching network further comprises a second parallel plate capacitor formed on the flexible substrate, the second parallel plate capacitors comprising two substantially parallel electrical traces formed on the flexible substrate, the first parallel plate capacitor oriented orthogonally to the second parallel plate capacitor on the flexible substrate.

8. The wearable device of claim 1, wherein the impedance matching network comprises an inductor.

9. The wearable device of claim 8, wherein the inductor comprises a coil inductor formed on the flexible substrate.

10. The wearable device of claim 8, wherein the impedance matching network further comprises a capacitor.

11. The wearable device of claim 10, wherein the capacitor comprises an interdigital capacitor.

12. A method comprising:
determining an inductance ("$L_A$") for an antenna;
determining an expected range of strains for the antenna based on predetermined a flexible substrate, the flexible substrate configured to flex in at least an X dimension and a Y dimension, wherein the X and Y dimensions are orthogonal and coplanar with a surface of the flexible substrate and each corresponding to a respective X or Y axis;
determining changes in $L_A$ based on the expected range of strains on the flexible substrate;
determining an orienation of one or more components of an impedance matching network based on the determined changes in $L_A$ and the expected range of strains, the orientation of the one or more components parrallel to one of the X or Y axis, wherein a capacitance ("$C_M$") or an inductance ("$L_M$") of the impedance matching network is configured to vary (i) based on a flexing of the one or more circuit components in the X or Y axis causing, and (ii) in proportion to the determined changes in $L_A$ based on flexing in the X or Y axis to maintain a substantially constant impedance of the combination of the impedance matching network and the antenna;
forming the antenna on a flexible substrate;
forming the impedance matching network on the flexible substrate, the one or more components of the impedance matching network having the determined orientation; and
coupling the antenna to the impedance matching network.

13. The method of claim 12, wherein the antenna is deformable in both of the X and Y dimensions, the impedance matching network further comprising one or more circuit components oriented parallel to the other of the X or Y axis, and wherein $C_M$ or $C_M$ is further configured to vary based on the flexing of the impedance matching network in both of the X or Y dimensions.

14. The method of claim 13, wherein the antenna is a loop antenna or a near-field communication antenna.

15. The method of claim 12, wherein the antenna is deformable in substantially only one of the X or Y dimensions, the one or more circuit components oriented parallel to the X or Y axis corresponding to the substantially only one of the X or Y dimensions.

16. The method of claim 12, wherein the impedance matching network comprises first and second metal traces configured as an interdigitated capacitor.

17. The method of claim 12, wherein the impedance matching network comprises a parallel plate capacitor formed on the flexible substrate, the parallel plate capacitor comprising two substantially parallel electrical traces formed on the flexible substrate, and wherein aligning the parallel plate capacitor with one of the X or Y axis comprises orienting the two substantially parallel electrical traces in parallel with the one of the X or Y axis.

18. The method of claim 17, wherein the parallel plate capacitor is a first parallel plate capacitor, and wherein the impedance matching network further comprises a second parallel plate capacitor formed on the flexible substrate, the second parallel plate capacitors comprising two substantially parallel electrical traces formed on the flexible substrate, the first parallel plate capacitor oriented orthogonally to the second parallel plate capacitor on the flexible substrate.

19. The method of claim 12, wherein the impedance matching network comprises an inductor.

20. The method of claim 19, wherein the inductor comprises a coil inductor formed on the flexible substrate.

21. The method of claim 19, wherein the impedance matching network further comprises a capacitor.

22. The method of claim 21, wherein the capacitor comprises an interdigital capacitor.

* * * * *